TRANSISTOR LOGIC CIRCUITS

Filed May 17, 1963 3 Sheets-Sheet 1

RICHARD E. BOHN
and RICHARD C. SIRRINE,
INVENTORS.

BY David M. Keay
AGENT.

RICHARD E. BOHN
and RICHARD C. SIRRINE,
INVENTORS.
BY David M. Keay
AGENT.

RICHARD E. BOHN
and RICHARD C. SIRRINE,
INVENTORS.

BY David M. Keay
AGENT.

United States Patent Office 3,229,119

Patented Jan. 11, 1966

3,229,119

TRANSISTOR LOGIC CIRCUITS

Richard E. Bohn, Danvers, and Richard C. Sirrine, Winchester, Mass., assignors to Sylvania Electric Products Inc., a corporation of Delaware Filed May 17, 1963, Ser. No. 281,183

8 Claims. (Cl. 307—88.5)

Figure 1:
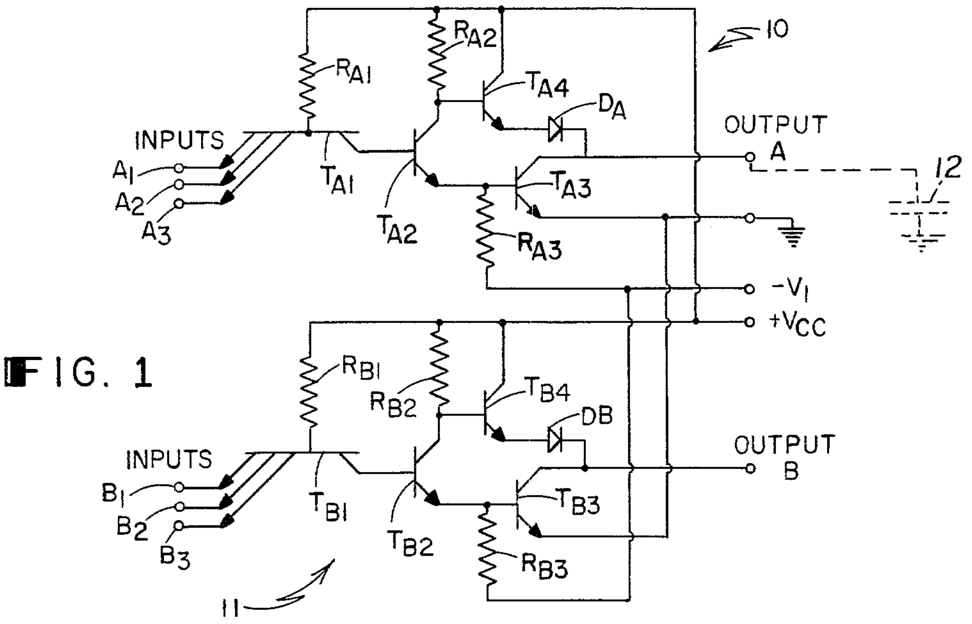

This invention relates to logic circuits employing transistors. More particularly, it is concerned with digital information handling circuits in which transistors are employed for switching, amplifying, inverting, and output level voltage setting.

The operating requirements for circuits employed in performing logic functions are becoming more stringent as the art of digital computers and data processing equipment advances. In particular, the time required for a circuit to perform a logic operation is a limiting factor on the data handling capability of computing apparatus. Problems are also encountered in providing circuits which are immune to noise, whether generated within or externally of the circuit. Logic circuits may also be restricted in their usefulness because of limited "fan-out." "Fan-out" is a measure of the number of succeeding logic circuits which can be operated with parallel input connections to the output connection of the circuit.

Size is also a significant consideration in the high speed data processing art. Logic circuits have been designed for fabrication within a single chip or die of semiconductor material. With these so-called integrated circuits the size of a complete logic circuit is reduced to that of a single standard electrical component. However, integrated logic circuits have certain problems in addition to those common to logic circuits in general. The ability to dissipate power is limited, and this situation may result in restricting the circuit to low fan-out. Since all of the components are located on a single small piece of semiconductor material there are problems of interaction between the individual components. In addition, the available electrical current may be limited and certain of the components may be deprived of the current necessary for proper operation.

It is an object of the present invention, therefore, to provide improved logic circuits.

It is a more specific object of the invention to provide logic circuits which have improved operating characteristics and which are amenable to fabrication as integrated circuits.

It is also an object of the invention to provide an integrated logic circuit incorporating an element which combines the electrical functions of more than one type of electrical component.

Briefly, logic circuits in accordance with the foregoing objects of the invention include an input circuit means which is adapted to produce a signal in response to a predetermined signal condition at its input. A first transistor circuit means connected to the input circuit means produces signals at first and second output connections in response to a signal from the input circuit means. A second transistor circuit means is responsive to a signal at the first output connection to change the voltage level at an output terminal from a first predetermined voltage output level to a second predetermined voltage level. The second transistor circuit means is also adapted to restore the voltage level at the output terminal to the first predetermined voltage level in response to termination of the signals at the first and second output connections.

It is a feature of the invention to provide an integrated circuit element in the second transistor circuit means which combines the functions of a transistor and a resistor with the resistor connected between the base and the collector of the transistor. The element also produces premature saturation effects in the transistor upon the existence of short circuit conditions in the collector-emitter circuit.

Figure 2:
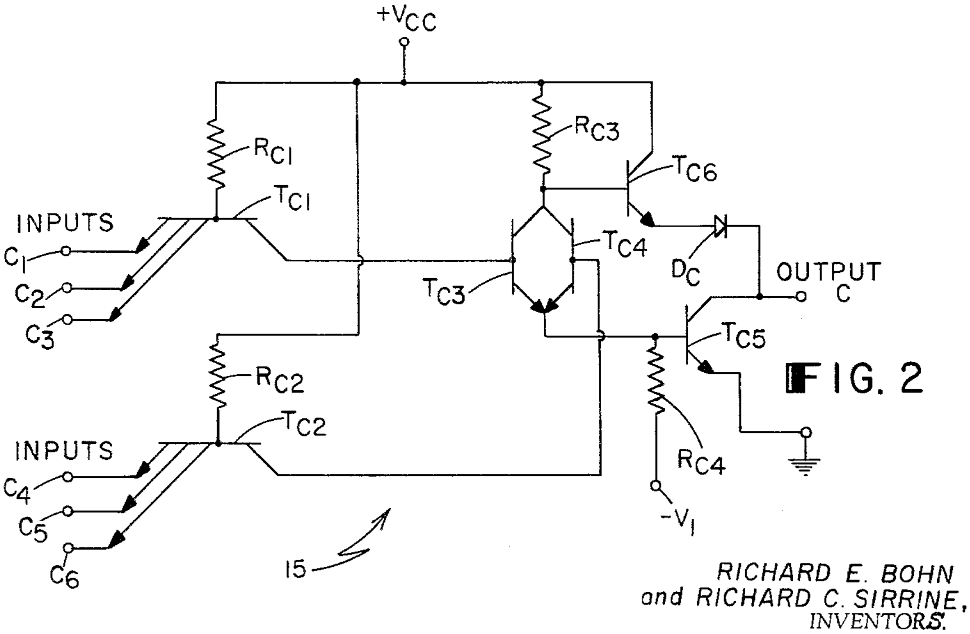
Figure 3:
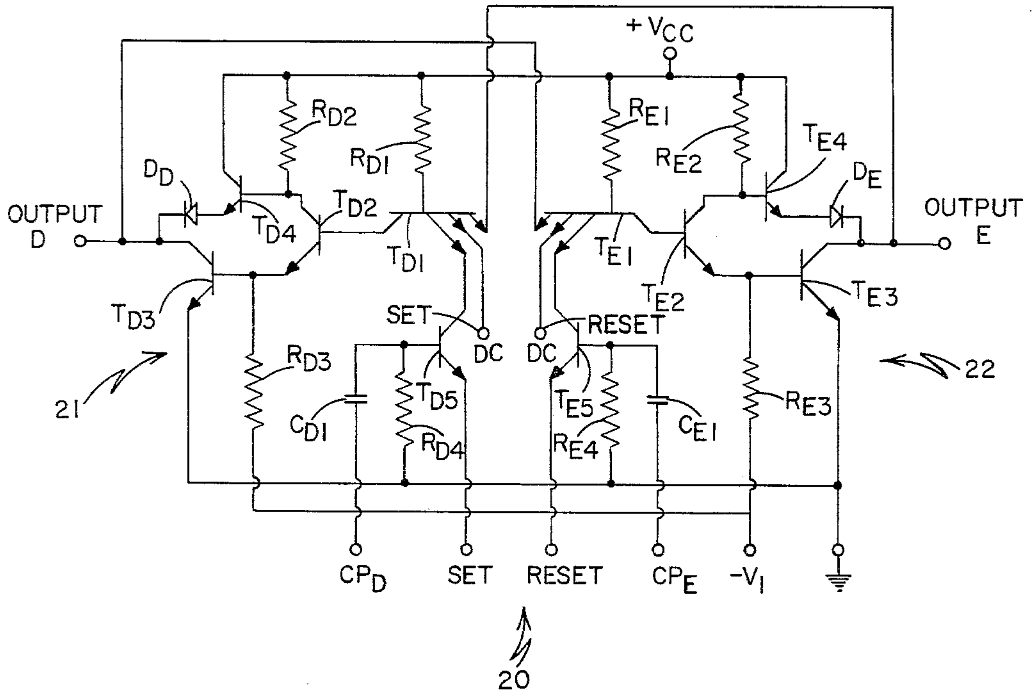
Figure 4:
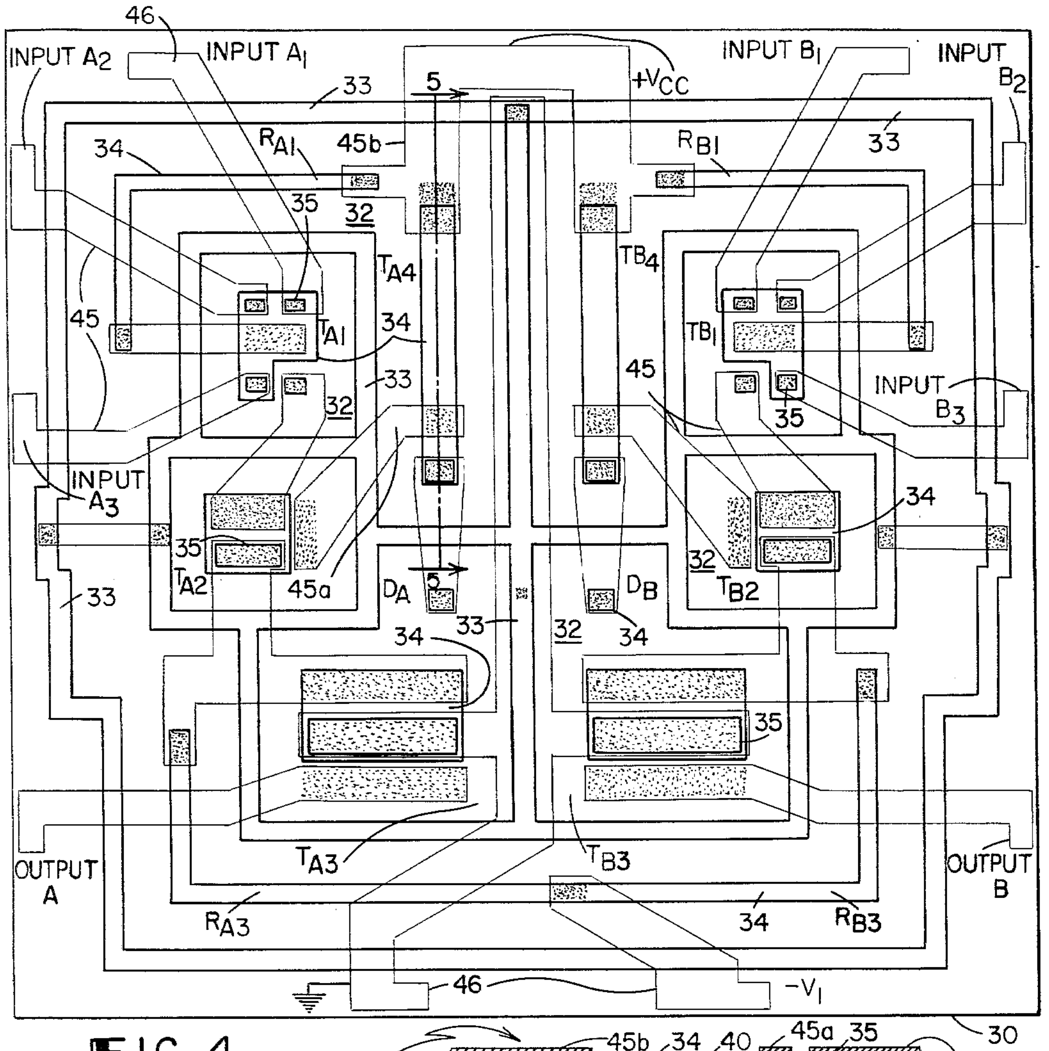
Figure 5:
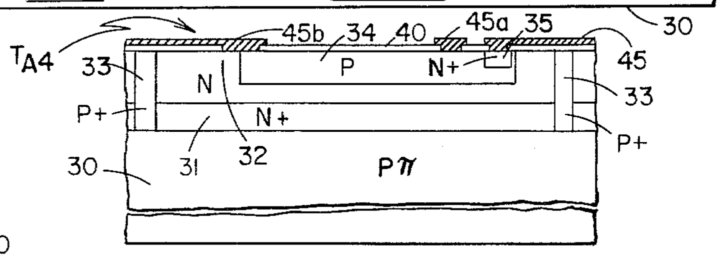
Figure 6:
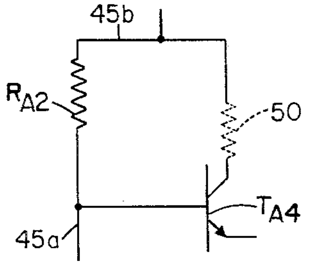

Additional objects, features, and advantages of logic circuits according to the invention will be apparent from the following detailed discussion and the accompanying drawings wherein:

FIG. 1 is a schematic diagram of a dual NAND logic circuit gate according to the invention, FIG. 2 is a schematic diagram of a NAND-OR logic circuit according to the invention, FIG. 3 is a schematic diagram of a set-reset flip-flop circuit according to the invention, FIG. 4 is a plan view of the dual NAND logic circuit shown schematically in FIG. 1 embodied as an integrated circuit in a die of semiconductor material, FIG. 5 is an elevational view in cross section of a portion of the semiconductor die of FIG. 4 taken along lines 5—5 of FIG. 4 showing an integrated circuit element which combines the functions of a transistor and resistor in a single element, and FIG. 6 is a circuit diagram of the equivalent circuit of the portion of the integrated circuit of FIG. 4 shown in the cross sectional view of FIG. 5.

FIG. 1 is a schematic circuit diagram of a dual NAND logic circuit gate according to the invention. The circuit network as shown includes two identical circuits 10 and 11 each of which is an independent NAND logic circuit.

The first NAND circuit 10 may be considered as being "off" when no input signals are being applied at the input terminals $A_1$, $A_2$, and $A_3$. The voltage at the terminals is at a low level and in logic terms may be called a "false" voltage. Under these conditions the voltage at the output terminal A is at a high level which may be termed a "true" voltage. Only during the concurrent occurrence of "true" voltage input signals at all three input terminals $A_1$, $A_2$, and $A_3$ does the circuit turn "on" and produce a low level "false" voltage at the output terminal A. When a "false" voltage exists at one or more of the input terminals $A_1$, $A_2$, and $A_3$, the circuit is "off" and a "true" voltage is produced at the output terminal A.

The low level or "false" voltages and the high level or "true" voltages produced at the output terminal are of the same value as those applied at the input terminals. Therefore, logic circuits according to the invention can be connected together serial and in parallel in any desired combination in order to process digital information.

The NAND logic circuit 10 of FIG. 1 includes an input circuit section which performs an AND logic function. In the particular circuit shown an NPN input transistor $T_{A1}$ has its base electrode connected through a resistance $R_{A1}$ to a source of positive voltage $V_{CC}$. The input to the transistor includes three emitter electrodes each of which is connected to an input terminal $A_1$, $A_2$, and $A_3$. The collector electrode of the input transistor $T_{A1}$ provides the output connection from the input section.

The logic function of inverting a signal from the input section in addition to the functions of amplifying and output voltage level setting are performed by a transistorized circuit section. A first NPN transistor $T_{A2}$ in this section has its base electrode connected to the output connection from the input section. Its collector electrode is connected through a collector resistance $R_{A2}$ to the positive voltage supply $V_{CC}$. The emitter electrode is connected through a pull-down resistance $R_{A3}$ to a source of negative voltage $V_1$. An NPN output transistor $T_{A3}$ has its base electrode connected to the emitter electrode of the first transistor $T_{A2}$, its emitter electrode connected to ground, and its collector electrode connected to the output terminal A of the circuit.

The amplifying and inverting section also includes an NPN voltage setting transistor $T_{A4}$ which has its base electrode connected to the collector of transistor $T_{A2}$ and its collector electrode connected to the positive voltage source $V_{CC}$. The emitter electrode of the voltage setting transistor is connected through a diode $D_A$ to the output terminal A. The diode is connected for forward conduction from the emitter electrode to the output terminal A.

The NAND logic circuit 10 of FIG. 1 operates in the following manner. When the input terminals $A_1$, $A_2$, and $A_3$ are all at the low voltage "false" level the circuit is "off" and a high voltage "true" level is produced at the output terminal A. The low voltage level at an input terminal may be caused by a low impedance between the terminal and ground. In this situation current flow from the supply $V_{CC}$ through the input resistance $R_{A1}$, the base-emitter diode of the transistor $T_{A1}$, and the low impedance connected to the input terminal produces a low voltage at the terminal. The low impedance between the input terminal and ground may be caused, for example, by an "on" condition in a preceeding logic circuit according to the invention to which the input terminal is connected as will be apparent from the explanation hereinafter.

With the emitters of the input transistor $T_{A1}$ at a low voltage level, current from the supply $V_{CC}$ flows through the input resistance $R_{A1}$ and the base-emitter diodes of the transistor. The greatest voltage drop occurs across the resistance $R_{A1}$ causing the voltage at the base of the input transistor $T_{A1}$ to be relatively low. Conduction in the collector circuit is thus slight and the voltage at the collector of the transistor is low.

The first transistor $T_{A2}$ of the inverting and amplifying section of the circuit is connected in series with collector resistance $R_{A2}$ and pull-down resistance $R_{A3}$ between the positive voltage supply $V_{CC}$ and the negative voltage supply $V_1$. The magnitude of the voltage of the negative source $V_1$ is slightly less than that of the positive source $V_{CC}$, and the resistance $R_{A3}$ is approximately five times the resistance of the resistance $R_{A2}$. This biasing arrangement is such that when the no signal low voltage from the collector of the input transistor $T_{A1}$ is applied at the base of the transistor $T_{A2}$, a small current flows through the transistor and the two series connected resistances $R_{A2}$ and $R_{A3}$. A fairly high voltage is thus established at the collector of transistor $T_{A2}$ and a fairly low voltage, slightly below ground, at the emitter.

Since the voltage produced at the emitter of the transistor $T_{A2}$ is low, the output transistor $T_{A3}$ is biased in the non-conducting condition. In this condition the transistor presents a high impedance between the output terminal A and ground.

The voltage at the collector of the transistor $T_{A2}$ is applied to the base of the voltage setting transistor $T_{A4}$. Under normall "off" conditions of the circuit the small leakage current of the output transistor $T_{A3}$ flows through the voltage setting transistor $T_{A4}$, although both transistors can be considered as being substantially non-conductive. The voltage drop across the forward resistance of the base-emitter diode of the transistor $T_{A4}$ and that of the series connected diode $D_A$ establishes the voltage level at the output terminal A.

As is well understood in the art of semiconductor logic circuits, when the voltage signal level at any one of the input terminals $A_1$, $A_2$, or $A_3$ is raised to the high voltage "true" level as by virtue of its being connected to the output terminal of a logic circuit which is turned "off," no change occurs at the collector electrode of the input transistor $T_{A1}$. Current flow through the base-emitter diode to the input terminal stops, since the diode is reversed biased. However, current continues to flow through the input resistance $R_{A1}$, and through the other base-emitter diodes of the transistor $T_{A1}$. Thus, the voltage, at the base electrode of the input transistor $T_{A1}$ is not changed, and the logic circuit remains "off." This situation continues to exist regardless of the number of input terminals so long as any one of them is biased at the low voltage "false" level.

When the voltage levels at all three input terminals $A_1$, $A_2$, and $A_3$ are at the high voltage "true" level concurrently, current from the supply $V_{CC}$ can no longer flow in the same manner because all the base-emitter diodes of the transistor $T_{A1}$ are reverse biased. As the flow of current is reduced the voltage at the base of the input transistor $T_{A1}$ rises thereby causing conduction through the transistor and increasing the voltage on the collector. This action at the base electrode of the transistor $T_{A2}$ causes greatly increased conduction through that transistor.

The increased current flow through the transistor $T_{A2}$ and its series connected resistances $R_{A2}$ and $R_{A3}$ lowers the voltage at the collector electrode and raises the voltage at the emitter electrode. The output transistor $T_{A3}$ is thereby biased to conduction providing a low impedance path between the output terminal A and ground and establishing a low voltage "false" level at the output terminal. The voltage at the base electrode of the voltage setting transistor $T_{A4}$ is such as to insure that the transistor remains in a non-conducting condition maintaining the output terminal A at a low voltage signal level.

Upon termination of the high voltage level signal at one or more of the input terminals $A_1$, $A_2$, or $A_3$, a base-emitter diode of the input transistor $T_{A1}$ becomes forward biased permitting current flow through the input resistance $R_{A1}$. The increased voltage drop across the resistance $R_{A1}$ lowers the potential at the base of the input transistor $T_{A1}$ thereby reducing conduction in the collector circuit and the potential at the collector. This condition biases the transistor $T_{A2}$ so that only slight conduction occurs through the transistor and series connected resistances $R_{A2}$ and $R_{A3}$. The voltage at the collector of the transistor $T_{A2}$ is thereby increased and that at the emitter is reduced.

The reduced voltage at the emitter electrode of transistor $T_{A2}$ biases the base of the output transistor $T_{A3}$ so as to render that transistor non-conducting. The output transistor $T_{A3}$ thus presents a high impedance between the output terminal A and ground. The increased voltage applied at the base of the voltage setting transistor $T_{A4}$ together with the low voltage level existing at the output terminal A causes that transistor to conduct. The transistor conducts heavily until the voltage at the output terminal A is restored to the level established by the voltage at the transistor base less the forward biasing voltage drop across the base-emitter diode of the transistor and the diode $D_A$.

The voltage at the output terminal A fails to revert to the high level immediately upon termination of current flow throught he output transistor $T_{A3}$ because of various capacitance effects on the output terminal A and its external connections as indicated by the capacitance symbol 12 shown in dashed lines. In order for the voltage at the output terminal A to rise, this load capacitance must be charged. The heavy flow of current from the supply $V_{CC}$ through the voltage setting transistor $T_{A4}$ charges the load capacitance very rapidly. When the output terminal A reaches the upper voltage "true" level as established by the voltage at the base of the voltage setting transistor $T_{A4}$, the transistor no longer conducts and the logic circuit is "off."

The second logic circuit 11 of the dual NAND gate operates in exactly the same manner as does the first circuit 10 providing a NAND logic function having three input terminals $B_1$, $B_2$, and $B_3$ and an output terminal B.

FIG. 2 is a schematic circuit diagram of a NAND-OR circuit gate 15 in which a low voltage "false" level is produced at the output terminal C when there is a coincidence of high voltage level input signals at input terminals $C_1$, $C_2$, and $C_3$, or when there is a coincidence of high voltage level input signals at input terminals $C_4$, $C_5$, $C_6$. When neither of these conditions exists at the input, a high voltage "true" level is produced at the output terminal C.

The input terminals $C_1$, $C_2$, and $C_3$ are connected to the three emitter electrodes of a first input transistor $T_{C1}$. This transistor is connected in a manner similar to the input transistor of FIG. 1. Its base electrode is connected through a first input resistance $R_{C1}$ to the positive voltage source $V_{CC}$, and its collector electrode is connected directly to the base of a first transistor $T_{C3}$ in the amplifying and inverting section of the circuit. The input terminals $C_4$, $C_5$, and $C_6$ are similarly connected to the emitter electrodes of a second input transistor $T_{C2}$ having its base electrode connected through a second input resistance $R_{C2}$ to the voltage source $V_{CC}$ and its collector electrode connected to the base of a second transistor $T_{C4}$ in the amplifying and inverting section.

The emitters and the collectors of the first two transistors $T_{C3}$ and $T_{C4}$ in the amplifying and inverting section are connected directly together. The common collector connection is connected through the collector resistance $R_{C3}$ to the positive voltage source $V_{CC}$. The common emitter connection is connected through a base pull-down resistance $R_{C4}$ to a source of negative voltage $V_1$.

An output transistor $T_{C5}$ is connected in a manner similar to the output transistor in the circuit of FIG. 1. The base is connected to the common emitter connection of transistors $T_{C3}$ and $T_{C4}$, the emitter is connected directly to ground, and the collector is connected directly to the output terminal C.

A voltage setting transistor $T_{C6}$ is also connected in the circuit similarly to the voltage setting transistor of FIG. 1. The base is connected to the common collector connection of the two transistors $T_{C3}$ and $T_{C4}$, and the collector is connected directly to the positive voltage source $V_{CC}$. The emitter is connected through a diode $D_C$ to the output terminal C.

A coincidence of high voltage "true" signals at the input terminals $C_1$, $C_2$, and $C_3$ causes increased conduction through the first transistor $T_{C3}$ of the amplifying and inverting section in accordance with the explanation of the operation of the circuit of FIG. 1. The signal produced at the emitter of transistor $T_{C3}$ causes the output transistor $T_{C5}$ to conduct thereby reducing the voltage at the output terminal C to the low "false" level.

Similarly a coincidence of "true" input signals at the input terminals $C_4$, $C_5$, and $C_6$ causes increased conduction through transistor $T_{C4}$. This condition affects the base of the output transistor $T_{C5}$, switching that transistor to a high conduction condition and reducing the voltage at the output terminal C to the low "false" level. Thus, an increased conduction condition in either transistor $T_{C3}$ or $T_{C4}$ causes the logic circuit to turn "on" and a low voltage "false" level to be produced at the output terminal C.

When a change occurs in the voltage signal levels at the input terminals so that signals from one or both of the input transistors $T_{C1}$ and $T_{C2}$ become terminated and no signals are transmitted to transistors $T_{C3}$ and $T_{C4}$, conduction through transistors $T_{C3}$ and $T_{C4}$ is slight. The resulting conditions at the common emitter connection and at the common collector connection cause the output transistor $T_{C5}$ to become non-conductive and the voltage setting transistor $T_{C6}$ to become conductive. Current flows through the voltage setting transistor charging the load capacitance until the output terminal C is restored to the high voltage "true" level. The manner of operation of the circuit to obtain rapid turning "off" is the same as that previously described in the discussion of the logic circuit of FIG. 1.

A set-reset flip-flop network 20 is illustrated in the circuit diagram of FIG. 3. The network includes two cross-coupled NAND circuits 21 and 22 according to the invention together with pulse-level input gates. When the network is functioning, one of the NAND circuits is "on" while the other is "off." The operating states of the circuits are reversed by a suitable combination of input signal conditions serving to turn the "on" circuit "off."

The first NAND logic circuit 21 is the same as either of the NAND circuits of FIG. 1. It includes a three input AND section having a three emitter transistor $T_{D1}$ with its base connected through a resistance $R_{D1}$ to a positive voltage source $V_{CC}$. Input connections are made to the emitters of the transistor and the output is taken from the collector.

The output for the AND section is applied to the base of a first transistor $T_{D2}$ in the amplifying and inverting section of the circuit. The collector of transistor $T_{D2}$ is connected through a resistance $R_{D2}$ to the positive voltage source $V_{CC}$, and its emitter is connected through a resistance $R_{D3}$ to a negative voltage source $V_1$. An output transistor $T_{D3}$ has its base connected to the emitter of transistor $T_{D2}$, its emitter connected to ground, and its collector connected to an output terminal D. A voltage setting transistor $T_{D4}$ has its base connected to the collector of transistor $T_{D2}$, its collector connected to the positive voltage source $V_{CC}$ and its emitter connected through a diode $D_D$ to the output terminal D.

A pulse-level input gate is connected to one of the emitters of the AND section transistor $T_{D1}$. The gate includes an input gate transistor $T_{D5}$ having its collector connected to the emitter of transistor $TD_1$ and its base connected through a resistance $R_{D4}$ to ground. The emitter of the input gate transistor $T_{D5}$ is connected to a "set" terminal, and the base is connected through a capacitance $C_{D1}$ to a first clock pulse terminal $CP_D$.

The second NAND logical circuit 22 is the same as the first circuit 21. A three emitter AND section transistor $T_{E1}$ is connected to an amplifying and inverting section including transistor $T_{E2}$, an output transistor $T_{E3}$, and a voltage setting transistor $T_{E4}$. The transistors are suitably connected to each other and to resistances and voltage sources to provide the proper voltage level at the output terminal E as explained previously.

A pulse-level input gate is connected to one of the emitters of the AND section transistor $T_{E1}$ of the second NAND logic circuit. The collector of the input gate transistor $T_{E5}$ is connected to the one emitter of transistor $T_{E1}$ and its base is connected through a resistance $R_{E4}$ to ground. The emitter of transistor $T_{E5}$ is connected to a "reset " terminal and the base is connected through a capacitance $C_{E1}$ to a second clock pulse terminal $CP_E$.

The inputs and outputs of the two NAND logic circuits are cross-coupled by a connection from the output terminal D of the first circuit to one of the emitters of the AND section transistor $T_{E1}$ of the second circuit and by a connection from the output terminal E of the second circuit to one of the emitters of the AND section transistor $T_{D1}$ of the first circuit. The third emitter of the AND section transistor $T_{D1}$ of the first circuit is connected to a "D.C. set" terminal and the third emitter of the corresponding transistor $T_{E1}$ in the second circuit is connected to a "D.C. reset" terminal.

In order to explain the operation of the flip-flop network 20, let it be assumed that the first NAND logic circuit 20 is "on" and the second NAND logic circuit 22 is "off." In order for this condition to exist, high voltage level signals must be present at all three emitters of the AND section transistor $T_{D1}$. The "D.C. set" and "D.C. reset" terminals are biased at the high voltage level by a continuous D.C. bias which is altered only to preset the conditions of the network cricuits prior to digital operation. Another emitter of transistor $T_{D1}$ is connected to the output terminal E of the second NAND logic circuit, and since the second circuit is "off" a high voltage level signal is present at the emitter.

The third emitter of the AND section transistor $T_{D1}$ is connected to the input gate transistor $T_{D5}$. There are two input connections to the input gate transistor; the "set" terminal and the first clock pulse terminal $CP_D$. The voltage level applied at the "set" terminal is either the low voltage "false" level or the high voltage "true" level. The clock pulse terminal $CP_D$ is normally biased at a low level near ground, and positive clock pulses are periodically applied to the terminal. During the time interval between clock pulses, the input gate transistor $T_{D5}$ remains non-conductive regardless of whether the voltage level at the "set" terminal is high or low. Thus, the input gate transistor $T_{D5}$ is normally non-conductive and a high voltage level is established at the third emitter of the AND section transistor $T_{D1}$.

In normal operation the flip-flop network is triggered to turn the first NAND logic circuit 21 "off" and the second logic circuit 22 "on" by the arrival of a positive clock pulse at the clock pulse terminal $CP_D$ while a low voltage level signal is being applied at the "set" terminal. The rising waveform of the clock pulse is differentiated by the capacitance $C_{D1}$ and resistance $R_{D4}$ combination to provide a positive signal at the base of the input gate transistor $T_{D5}$. If a high voltage level signal is being applied at the "set" terminal, the signal at the transistor base has no effect and the transistor remains non-conductive. However, if a low voltage signal is being applied at the "set" terminal, the signal at the base of the input transistor $T_{D5}$ biases that transistor to conduction.

Momentary conduction through the input gate transistor $T_{D5}$ caused by a low voltage signal at the "set" terminal during the occurrence of a positive clock pulse at the clock pulse terminal $CP_D$ causes a momentary drop in the voltage level at the emitter of the AND section transistor $T_{D1}$ to which the collector of transistor $T_{D5}$ is connected. As previously explained in describing NAND logic circuits according to the invention, this condition causes the first NAND logic circuit 21 to turn "off." The voltage at the output terminal B is thereby raised to the high voltage level.

In the second NAND logic circuit 22 the "D.C. reset" terminal is held at the high voltage level as explained previously and since the pulse-level input gate is not conducting, the emitter of the AND section transistor $T_{E1}$ connected to the input gate transistor $T_{E5}$ is at the high voltage level. Therefore, when a high voltage level is established at the third emitter of the AND section transistor $T_{E1}$ by the connection to the output terminal D, the second NAND logic circuit 22 is turned "on." The voltage at the output terminal E is thereby reduced to the low voltage level. This voltage level is applied to an emitter of the AND section transistor $T_{D1}$ of the first logic circuit 21, thus maintaining that circuit "off" after the clock pulse at the clock pulse terminal $CP_D$ has terminated and the input gate transistor has returned to the non-conducting condition.

The operating states of the two NAND logic circuits may be reversed again by a positive going clock pulse arriving at the second clock pulse terminal $CP_E$ while the "reset" terminal is being held at the low voltage level. Current flow through the input gate transistor $T_{E5}$ lowers the voltage on the emitter of the AND section transistor $T_{E1}$ causing the second logic circuit to turn "off," and the connection between the output terminal E and the emitter of the AND section transistor $T_{E1}$ causes the first NAND logic circuit to turn "on."

The dual NAND circuit shown schematically in FIG. 1 is illustrated in the form of an integrated circuit in the plan view of FIG. 4. An elevational view in cross section of a portion of the die 30 of semiconductor material in which the circuit elements are fabricated is shown in FIG. 5. For ease in understanding, the reference characters employed in FIG. 1 are used where applicable in FIG. 4.

As can best be seen from the cross sectional view of FIG. 5 the circuitry is fabricated by epitaxially growing layers of semiconductor material on a substrate and diffusing conductivity type imparting materials into the epitaxial layers. In actual practice hundreds of integrated circuits are fabricated simultaneously on a relatively large slice of semiconductor material. However, for purposes of illustration only a single integrated circuit formed in a small portion of such a slice is shown in FIGS. 4 and 5. The substrate of semiconductor material is a body 30 of single crystal silicon of high resistivity P-type conductivity. A thin layer 31 of low resistivity N-type silicon is grown on the substrate by known epitaxial techniques. Another layer 32 of N-type silicon having higher resistivity is then grown on the first epitaxial layer.

The various circuit elements are then fabricated by a series of steps in which conductivity type imparting materials are selectively diffused into regions of the silicon die. Known techniques of coating the surface of the die with a protective non-conductive oxide layer, masking with a photo-resistant material, and etching to provide openings in the oxide coating through which a conductivity type imparting material may be diffused are utilized prior to each diffusion step to delineate the regions into which the conductivity type imparting material is to be diffused. A P-type conductivity imparting material is first diffused into the appropriate regions of the semiconductor die to provide high condutcivity P-type isolating regions 33 for isolating the various electrical elements from each other. Then, a P-type conductivity imparting material is diffused into regions 34 of the N-type epitaxial layer to provide the base regions for the transistors, the resistance components, and also the anode regions of the diodes. Finally, the emitter regions of the transistors are produced by the diffusion of an N-type conductivity imparting material into regions 35 of the base regions 34. The boundaries, or junctions, of each region of a single conductivity type are indicated by relatively heavy lines in FIG. 4.

Following the diffusion steps, the protective oxide coating 40 is reconstituted, and openings are etched in the coating over the areas on the surface of the die at which electrical connections are to be made to the underlying semiconductor material. The entire surface of the die is then coated with an adherent layer of conductive material, as by vapor deposition of aluminum. Portions of the aluminum layer are then removed by appropirate masking and etching steps to leave a pattern of electrical connections 45 to the circuit elements. The edges of the electrical connections are indicated by relatively thin lines in FIG. 4. The areas at which the electrical connections make contact to electrical elements at openings in the oxide coating are designated by stippling in FIG. 4. Terminals to which the external connections of the circuit are to be made are provided by large areas 46 of the aluminum layer located near the edges of the die. The completed integrated circuit as illustrated in FIG. 4 may be placed in any suitable enclosure having leads to which the terminal areas 46 may be connected.

In the version of the integrated circuit illustrated in FIG. 4 the diodes, four of the resistances, and six of the transistors are generally in accord with known structures of components formed by diffusion of conductivity type imparting materials into semicondutcor material. Each of the voltage setting transistors $T_{A4}$ and $T_{B4}$ and its associated resistance $R_{A2}$ and $R_{B2}$, however, as shown in FIGS. 4 and 5 are fabricated as a single element. Although the NAND logic circuit illustrated schematically in FIG. 1 may be constructed with discrete electrical components or as an integrated circuit in which each electrical function is performed by a separate element, certain advantages are obtained by combining the voltage setting transistor with the associated resistance in a single element.

The P-type region which constitutes the base of the voltage setting transistor $T_{A4}$ is elongated relative to the base region of other transistors. A first electrical connection $45a$ is made to the base region adjacent the base-emitter junction and a second connection $45b$ is made at the end of the base region away from the emitter. This second connection also makes contact to the collector region of the transistor. The elongated P-type region between the connections $45a$ and $45b$ thus serves both as the resistance component $R_{A2}$ between the collector and base of transistor $T_{A4}$ and as the base region of the transistor. The magnitude of the resistance depends on the resistivity and dimensions of the region.

FIG. 6 is a schematic circuit diagram of the equivalent circuit of the combined transistor-resistor element of FIG. 5. Under normal operating conditions as explained previously the positive supply voltage $V_{CC}$ is applied at the connection $45b$. The resistance $R_{A2}$ is thereby connected between the supply voltage and the base of the transistor, and there is a direct connection between the voltage source and the collector region.

When the logic circuit 10 of FIG. 1 is functioning as explained previously in this application, the transistor $T_{A4}$ is caused to conduct by virtue of the termination of a signal at its base (via connection $45a$) which increases the base potential while the output terminal of the circuit which is connected to the emitter is at a low voltage level. Heavy current flows through the collector and emitter to charge the load capacitance and to raise the voltage level at the output terminal. Since the only resistance connected between the output terminal and the voltage source is that of the heavily conducting transistor and the forward biased diode, the voltage at the output terminal is increased to the desired level in a very short time, on the order of $8\times10^{-9}$ seconds.

With an ordinary transistor connected to a resistance, voltage source, and output terminal in this manner, if the emitter should be held at a low potential as by inadvertent grounding of the output terminal, the transistor would tend to draw a heavy current. Although a transistor can safely pass a heavy current during the few nanoseconds required to change the load capacitance, sustained current flow may burn out an ordinary transistor subjected to this short circuit condition.

By virtue of the length of the current path from the connection $45b$ for the supply voltage at the collector of the transistor $T_{A4}$ to the emitter, however, a resistance effect to sustained high current flow is produced in the element. This effect between the connection $45b$ and the collector junction of the transistor is indicated by a resistance 50 illustrated in phantom in FIG. 6. The short circuit current through the transistor is reduced by the resistance effect and burnout does not occur. The structure may also be thought of as causing a premature saturation effect in the transistor under conditions of sustained high current flow, thereby causing a drop in the amplification factor of the transistor and consequently limiting the collector current.

Logic circuits according to the invention provide many advantages over circuits previously available. The time required for the circuit to be completely turned "on" after a high voltage level is applied at each input terminal is small. Even more significant, the time required for restoring the voltage at the output terminal from the low level to the high level after the voltage level at an input terminal is reduced is very rapid. This propagation delay is usually the limiting factor determining the operating rate of known logic circuits.

The circuits disclosed are relatively immune to triggering by noise. The amplification provided by transistors in the circuit permits a large difference in the "false" and "true" voltage levels employed. Thus, spurious signals are much less likely to affect the circuit.

In each circuit the output terminal is restored to the high voltage level by current supplied from the voltage source through the elements of the circuit. That is, the restoring current for charging the load capacitance is not supplied from succeeding logic circuitry. The circuit is, therefore, relatively insensitive to loading and the fan-out (number of succeeding circuits which can be connected to the output terminal) is large. Isolation of each circuit from the adjacent circuits eliminates any tendency for components in one circuit to deprive a component in an adjacent circuit of current necessary for proper operation. Because of the current gain in the circuit and the load capacitance driving capability of the voltage setting transistor, a high input impedance is allowable at the input terminals; and, therefore, high fan-out can be obtained without requiring heavy power dissipation in the circuit.

What is claimed is:

1. A logic circuit including in combination an input circuit means adapted to produce a signal in response to a predetermined signal condition at the input thereto, a first transistor circuit means connected to said input circuit means and responsive to said signal to produce signals at first and second output connections, a second transistor circuit means including a second transistor connected to the first of said output connections, an output terminal, and a source of reference potential, and responsive to the signal at the first of said output connections to bias the second transistor to conduction and change the voltage level at the output terminal from a first pedetermined voltage level to a second predetermined voltage level, and a third transistor circuit means including a third transistor connected to the second of said output connections and to said output terminal and resposnive to termination of the signal at the second of said output connections to bias the third transistor to conduction and change the voltage level at the output terminal from said second predetermined voltage level to said first predetermined voltage level, and responsive to restoration of said first predetermined voltage level at the output terminal to bias the third transistor to non-conduction.

2. A logic circuit icluding in combination an input circuit means adapted to produce a signal in response to the occurrence of a predetermined signal condition at the input thereto;

a first transistor circuit means having a first transistor with an input electrode connected to the input circuit means and being adapted to produce output signals at the other two electrodes of the transistor in response to the presence of said signal at the input electrode;

a voltage setting transistor having its input electrode connected to one of said other two electrodes of the first transistor and its output electrode connected to an output terminal, circuit means biasing said voltage setting transistor to produce a first predetermined voltage level at the output terminal during the absence of an output signal from the first transistor circuit; and an output transistor having its input electrode connected to the other of said other two electrodes of the first transistor and its other electrodes connected between the output terminal and a source of reference potential circuit means biasing said output transistor to provide a high impedance between the output terminal and said source of reference potential during the absence of an output signal from the first transistor circuit, said circuit means also biasing said output transistor to provide a low impedance path between the output terminal and said source of reference potential in response to the presence of an output signal from said first transistor circuit thus producing a second predetermined voltage level at the ouput terminal;

said circuit means associated with the voltage setting transistor biasing said voltage setting transistor to cause conduction therethrough to restore the voltage at the output terminal from the second voltage level to the first voltage level in response to the presence of the second voltage level at the output terminal during the absence of an output signal from the first transistor circuit, and biasing said voltage setting transistor to non-conduction in response to restoration of the first voltage level at the output terminal.

3. A logical circuit including in combination an input circuit means adapted to produce a signal at an output connection during the concurrent occurrence of a first voltage level at a plurality of input terminals;

a first transistor having its base electrode connected to the output connection of the input circuit means, its emitter electrode connected through a resistance to one source of reference potential, and its collector electrode connected through a resistance to another source of reference potential providing a voltage drop across the transistor and the series connected resistances whereby the absence of a signal at the output connection of the input circuit means biases the first transistor to a low conduction condition and the presence of a signal at the output connection of the input circuit means biases the first transistor to a high conduction condition;

a voltage setting transistor, voltage setting transisor circuit menas connecting the base electrode of the voltage setting transistor to the collector electrode of the first transistor, the collector electrode of the voltage setting transistor to said other source of reference potential, and the emitter electrode of the voltage setting transistor to an output terminal, and operable to bias the voltage setting transistor to produce the first voltage level at the output terminal while the first transistor is in the low conduction condition;

an output transistor, output transistor circuit means connecting the base electrode of the ouput transistor to the emitter electrode of the first transistor, the collector electrode of the output transisor to the output terminal, and the emitter electode of the output transistor to a source of reference potential;

said output transistor circuit means being operable to bias the output transistor to a substantially non-conducting condition while the first transistor is in the low conduction condition, and being operable to bias the output transistor to a high conducting condition and produce a second voltage level at the output terminal while the first transistor is in the high conduction condition;

said voltage setting transistor circuit means being operable to bias the voltage setting transistor to a high conducting condition in response to the presence of the second voltage level at the output terminal while the first transistor is in the low conduction condtion, and being operable to bias the voltage setting transistor to a substantially non-conducting condtion in response to restoration of the first voltage level at the output terminal.

4. A logic circuit including in combination an input circuit means adapted to produce a signal in response to a predetermined combination of concurrent signals at a plurality of input terminals;

a first transistor circuit means including a first transistor having an input electrode connected to the input circuit means, said first transistor circuit means being adapted to produce output signals at the other two electrodes of the first transistor in response to the presence of a signal from said input circuit means at the input electrode of the first transistor;

an output transistor circut means including an output transistor having an input electrode connected to one of said other two electrodes of the first transistor and its other electrodes connected between an output terminal and a source of reference potential, said output transistor circuit means being adapted to provide a low impedance path between the output terminal and said source of reference potential in response to the presence of an output signal from first transistor circuit means;

said output transistor circuit means also being adapted to provide a high impedance path between the output terminal and said source of reference potential in response to the absence of an output signal form said first transistor circuit means; and a voltage setting transistor circuit means including a voltage setting transistor having an input electrode connected to the other of said other two electrodes of the first transistor and an output electrode connected to said output terminal, said voltage setting transistor circuit means being adapted to produce and maintain a predetermined voltage level at the output terminal in response to the termination of an out signal from said first transistor circuit means, said voltage setting transistor circuit means being operable to cause conduction through said voltage setting transistor to said output terminal so as to establish said predetermined voltage level at the output terminal in response to the absence of an output signal from said first transistor circuit means at the input electrode of the voltage setting transistor while said predetermined voltage level is not present at the output terminal, and being operable to bias the voltage setting transistor to non-conduction in response to the presence of said predetermined voltage level at the output terminal.

5. A logic circuit including in combination an input circuit means adapted to produce a signal at an output connection during the occurrence of a predetermined combination of concurrent signals at a plurality of input terminals;

a first transitor having its base electrode connected to the output connection of the input circuit means, its emitter electrode connected through a resistance to one source of reference potential, and its collector electrode connected through a resistance to another source of reference potential providing a voltage drop across the transistor and the series connected resistances, whereby output signals are produced at the emitter electrode and the collector electrode during the occurrence of a signal at the output connection of the input circuit means.

a voltage setting transistor, circuit means connecting the base electrode of the voltage setting transistor to the collector electrode of the first transistor, the collector electrode of the voltage setting transistor to said other source of reference potential, and the emitter electrode of the voltage setting transitor to an output terminal, and operable to bias the voltage setting transistor to produce a first predetermined voltage level at the output terminal during the absence of an output signal at the collector electrode of the first transistor;

an output transistor, circuit means connecting the base electrode of the output transistor to the emitter electrode of the first transistor, the collector electrode of the output transistor to the output terminal, and the emitter electrode of the output transistor to a source of reference potential, and operable to bias the output transistor to provide a high impedance between the output terminal and said last-mentioned source of reference potential during the absence of an output signal at the emitter electrode of the first transistor, and to provide a low impedance path between the output terminal and said last-mentioned source of reference potential during the occurrence of an output signal at the emitter electrode of the first transistor thus producing a second pretetermined voltage level at the output terminal; and said circuit means associated with the voltage setting transistor being operable to bias the voltage setting transistor to initiate conduction therethrough in response to the absence of an output signal at the collector electrode of the first transistor and the presence of the second predetermined voltage level at the output terminal and restore the voltage level at the output terminal to the first predetermined voltage level, and operable to bias the voltage setting transistor to non-conduction in response to restoration of the first predetermined voltage level at the output terminal.

6. A logic circuit including in combination a first input circuit means adapted to produce a signal at a first output connection in response to a predetermined combination of concurrent signals at a first plurality of input terminals, a second input circuit means adapted to produce a signal at a second output connection in response to a predetermined combination of concurrent signals at a second plurality of input terminals, a first transistor circuit means including a first transsistor having an input electrode connected to the output connection of the first input circuit means, said first transistor circuit means being adapted to produce output signals at first and second output electrodes of the first transistor in response to the presence of a signal from said first input circuit means at the input electrode of the first transistor, a second transistor circuit means including a second transistor having an input electrode connected to the output connection of the second input circuit means, said second transistor circuit means being adapted to produce output signals at first and second output electrodes of the second transistor in response to the presence of a signal from said second input circuit means at the input electrode of the second transistor, the first output electrodes of the first and second transsistors being connected to each other, the second output electrodes of the first and second transistors being conected to each other, an output transistor circuit means including an output transistor having an input electrode connected to the first output electrodes of the first and second transsistors and its other electrodes connected between an output terminal and a source of reference potential, said output transistor circuit means being adapted to provide a low impedance path between the output terminal and the source of reference potential in response to the presence of an output signal at a first output electrode of said first and second transistors, a voltage setting transistor circuit means including a voltage setting transistor having an input electrode connected to the second output electrodes of the first and second transistors and an output electrode connected to said output terminal, said voltage setting transistor circuit means being adapted to produce and maintain a predetermined voltage level at the output terminal during the absence of output signals at the second output electrodes of said first and second transistors, said voltage setting transistor circuit means being operable to cause conduction through said voltage setting transistor to said output terminal so as to establish said predetermined voltage level at the output terminal in response to the absence of output signals at the second output electrodes of the first and second transistors while said predetermined voltage level is not present at the output terminal, and being operable to bias the voltage setting transistor to non-conduction in response to the presence of said predetermined voltage level at the output terminal.

7. A logic circuit including in combination a first input circuit means adapted to produce a signal at a first output connection during the occurrence of a predetermined combination of concurrent signals at a first plurality of input terminals, a second input circuit means adapted to produce a signal at a second output connection during the occurrence of a predetermined combination of concurrent signals at a second plurality of intput terminals, a first transistor having its base electrode connected to the output connection of the first input circuit means, a second transistor having its base electrode connected to the output connection of the second input circuit means, the emitter electrodes of the first and second transistors being connected to each other and through a resistance to a source of voltage of one polarity, the collector electrodes of the first and second transistors being connected to each other and through a resistance to a source of voltage of the opposite polarity, an output transistor having its base electrode connected to the emitter electrodes of the first and second transistors, its collector electrode connected to an output terminal, and its emitter electrode connected to ground, and a voltage setting transistor having its base electrode connected to the collector electrodes of the first and second transistors, its collector electrode connected to the source of voltage of opposite polarity, and its emitter electrode connected to the output terminal, the absence of signals at the output connections of the first and second input circuit means biasing both the first and second transistors to low conduction conditions thereby biasing the output transistor and the voltage setting transistor to substantially non-conduction conditions, the voltage setting transistor setting the voltage at the output terminal at a first voltage level, the presence of a signal at the output connection of one of said input circuit means biasing the transistor connected thereto to a high conduction condition thereby biasing the output transistor to a high conduction permitting the voltage at the output terminal to change to a second voltage level, termination of a signal at the output connection of one of said input circuit means and the absence of a signal at the output connection of the other input circuit means biasing the first and second transistors to low conduction conditions thereby biasing the output transistor to a substantially non-conduction condition and biasing the voltage setting transistor to a high conduction condition until current flow therethrough restores the voltage at the output terminal to the first voltage level and biases the voltage setting transistor to a substantially non-conduction condition.

8. A flip-flop circuit including in combination a first input circuit means adapted to produce a signal at an output connection during the concurrent occurrence of a first predetermined voltage level at first and second input terminals;

a first transistor having its base electrode connected to the output connection of the first input circuit means, its emitted electrode connected through a resistance to one source of reference potential, and its collector electrode connected through a resistance to another source of reference potential providing a voltage drop across the transistor and the series connected resistances, whereby output signals are provided at the emitter electrode and the collector electrode during the occurrence of a signal at the output connection of the first input circuit means;

a first voltage setting transistor, first voltage setting transistor circuit means connecting the base electrode of the first voltage setting transistor to the collector electrode of the first transistor, the collector electrode of the first voltage setting transistor to said other source of reference potential, and the emitter electrode of the first voltage setting transistor to a first output terminal, and operable to bias the first voltage setting transistor to produce the first predetermined voltage level at the output terminal during the absence of an output signal at the collector electrode of the first transistor;

a first output transistor, first output transistor circuit means connecting the base electrode of the first output transistor to the emitter electrode of the first transistor, the collector electrode of the first output transistor to the first output terminal, and the emitter electrode of the first output transistor to a source of reference potential, and operable to bias the first output transistor to provide a high impedance between the first output terminal and said last-mentioned source of reference potential during the absence of an output signal at the emitter electrode of the fisrt transistor, and to provide a low impedance path between the first output terminal and said last-mentioned source reference potential during the occurrence of an output signal at the emitter electrode of the first transistor thus producing a second predetermined voltage level at the first output terminal;

said first voltage setting transistor circuit means being operable to bias the first voltage setting transistor to initiate conduction therethrough in response to the absence of an output signal at the collector electrode of the first transistor and the presence of the second predetermined voltage level at the first output terminal and restore the voltage level at the first output terminal to the first predetermined voltage level, and operable to bias the first voltage setting transistor to non-conduction in response to restoration of the first predetermined voltage level at the first output terminal;

a second input circuit means adapted to produce a signal at an output connection during the concurrent occurrence of the first predetermined voltage level at first and second input terminals;

a second transistor having its base electrode connected to the output connection of the second input circuit means, its emitter electrode connected through a resistance to the one source of reference potential, and its collector electrode connected through a resistance to said other source of reference potential providing a voltage drop across the transistor and the series connected resistances, whereby output signals are produced at the emitter electrode and the collector electrodes during the occurance of a signal at the output connection of the second input circuit means;

a second voltage setting transistor, second voltage setting transistor circuit means connecting the base electrode of the second voltage setting transistor to the collector electrode of the second transistor, the collector electrode of the second voltage setting transistor to said other source of reference potential, and the emitter electrode of the second voltage setting transistor to a second output terminal, and operable to bias the second voltage setting transistor to produce the first predetermined voltage level at the output terminal during the absence of an output signal at the collector electrode of the second transistor;

a second output transistor, second output transistor circuit means connecting the base electrode of the second output transistor to the emitter electrode of the second transistor, the collector electrode of the second output transistor to the second output terminal, and the emitter electrode of the second output transistor to a source of reference potential, and operable to bias the second output transistor to provide a high impedance between the second output terminal and said last-mentioned source of reference potential during the absence of an output signal at the emitter electrode of the second transistor, and to provide a low impedance path between the second output terminal and said last-mentioned source of reference potential during the occurrence of an output signal at the emitter electrode of the second transistor thus providing the second predetermined voltage level at the second output terminal;

said second voltage setting transistor circuit means being operable to bias the second voltage setting transistor to initiate conduction therethrough in response to the absence of an output signal at the collector electrode of the second transistor and the presence of the second predetermined voltage level at the second output terminal and restore the voltage level at the second output terminal to the first predetermined voltage level, and operable to bias the second voltage setting transistor to non-conduction in response to restoration of the first predetermined voltage level at the second output terminal;

a connection from the first output terminal to the first input terminal of the second input circuit means for applying the voltage level at the output terminal to the input terminal;

a connection from the second output terminal to the first input terminal of the first input circuit means for applying the voltage level at the output terminal to the input terminal;

a first input gate means connected to the second terminal of the first input circuit means, said first input gate means being adapted to maintain the second input terminal at the first predetermined voltage level and also being adapted to produce a momentary charge in the voltage level at the input terminal from the first predetermined voltage level to the second predetermined voltage level; and a second input gate means connected to the second terminal of the second input circuit means, said second input gate means being adapted to maintain the second input terminal at the first predetermined voltage level and also being adapted to produce a momentary change in the voltage level at the input terminal from the first predetermined voltage level to the second predetermined voltage level.

References Cited by the Examiner

UNITED STATES PATENTS

| | | | |
|---|---|---|---|
| 2,901,638 | 8/1959 | Huang | 307—88.5 |
| 3,009,070 | 11/1961 | Barnes | 307—88.5 |

OTHER REFERENCES

Kellett: "Elliott Scheffer Strokes . . .," Electronic Engineering (mag.), September 1960, pages 534 to 539, pages 535, 536, and 537 relied on.

Epsco Bulletin TDC–112, Power Amplifier, November 1958 (1 sheet with 2 sides, side 1 relied on).

Aronson et al.: RCA Technical Note, RCA TN No. 36, Rec'd. U.S.P.O. August 1957 (1 page).

GEORGE N. WESTBY, *Primary Examiner.*

ARTHUR GAUSS, D. D. FORRER, *Assistant Examiners.*